(12) United States Patent
Kawana et al.

(10) Patent No.: US 11,843,035 B2
(45) Date of Patent: Dec. 12, 2023

(54) TRANSISTOR INTERFACE BETWEEN GATE AND ACTIVE REGION

(71) Applicant: Micron Technology, Inc., Boise, ID (US)

(72) Inventors: Moeko Kawana, Hiroshima (JP); Yoshikazu Moriwaki, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/129,760

(22) Filed: Dec. 21, 2020

(65) Prior Publication Data

US 2022/0199779 A1 Jun. 23, 2022

(51) Int. Cl.
*H01L 29/201* (2006.01)
*H01L 21/20* (2006.01)
*H01L 21/02* (2006.01)

(52) U.S. Cl.
CPC ...... *H01L 29/201* (2013.01); *H01L 21/02694* (2013.01); *H01L 21/20* (2013.01)

(58) Field of Classification Search
None
See application file for complete search history.

(56) References Cited

U.S. PATENT DOCUMENTS

| 9,040,370 | B2* | 5/2015 | Yang | H01L 23/5252 438/281 |
| 2006/0046354 | A1* | 3/2006 | Kreipl | H10B 20/20 257/E21.666 |
| 2010/0032732 | A1* | 2/2010 | Booth, Jr. | H01L 23/5252 257/E21.409 |
| 2011/0031582 | A1* | 2/2011 | Booth, Jr. | H01L 23/5252 257/734 |
| 2014/0138777 | A1* | 5/2014 | Wang | G11C 17/18 438/238 |
| 2016/0035735 | A1* | 2/2016 | Hafez | H01L 23/5252 257/50 |
| 2020/0135746 | A1* | 4/2020 | Liaw | H01L 23/5226 |
| 2020/0295161 | A1* | 9/2020 | Toh | H01L 29/0653 |
| 2021/0167209 | A1* | 6/2021 | Liao | H01L 27/0886 |

FOREIGN PATENT DOCUMENTS

TW 201939714 A 10/2019

* cited by examiner

*Primary Examiner* — Khaja Ahmad
(74) *Attorney, Agent, or Firm* — Dorsey & Whitney LLP

(57) ABSTRACT

Semiconductor devices including structures of active region are disclosed. An example semiconductor device according to the disclosure includes a substrate, a layer on the substrate and a dielectric layer on the layer. The layer includes an interface in contact with the dielectric layer. The interface includes a first portion on a surface of the layer and a second portion perpendicular to the first portion.

17 Claims, 5 Drawing Sheets

US 11,843,035 B2

TRANSISTOR INTERFACE BETWEEN GATE AND ACTIVE REGION

BACKGROUND

High data reliability, high speed of memory access, lower power consumption and reduced chip size are features that are demanded from semiconductor memory.

Recently, an alloy of silicon-germanium (SiGe) has been emerged as material used in a channel region of a transistor in semiconductor memory. The SiGe alloy has higher carrier mobility compared to monocrystalline silicon (Si). Due to high carrier mobility of the silicon-germanium in the channel region, a threshold voltage between a gate and a source of the transistor, such as a p-channel type device, can decrease. The reduced negative threshold voltage increases a current within the p-channel type device at an on state. The alloy of silicon-germanium (SiGe) is known to improve negative bias temperature instability (NBTI) of a p-channel device.

Memory cells of memory devices such as dynamic random access memories (DRAMs), static RAMs (SRAMs), flash memories, or the like can experience defects leading to errors and/or failures. In some cases, memory cells can be identified as defective (hereinafter "defective memory cells") after the memory device (e.g., a memory chip) has been packaged, such as in cases where the memory cells were not defective before the packaging process. Examples of packaging include, but are not limited to, encapsulation by epoxy, ceramic packages, metal/glass packages, and the like. After a memory device has been packaged, the memory device can be tested to identify defective memory cells. Addresses mapped (e.g., assigned) to defective memory cells can be remapped (e.g., reassigned) to functional memory cells (e.g., memory cells that have not been identified as defective) so that the memory device can still be effective.

Programmable elements, such as fuses or antifuses of memory devices can be programmed to store data corresponding to one or more addresses mapped to defective memory cells. One example of a group of programmable elements is a row of antifuses. An antifuse has a high resistance in its initial state. An antifuse can permanently create an electrically conductive path when a relatively high voltage is applied across the antifuse. An antifuse can have a structure similar to that of a capacitor, i.e., two conductive electrical terminals are separated by a dielectric layer, such as a gate oxide film. To create an electrically conductive path, a relatively high voltage is applied across the terminals, breaking down the interposed dielectric layer and forming a conductive link between the antifuse terminals. Creating a conductive path through an antifuse is referred to as "blowing an antifuse."

A conventional antifuse has a planar interface between an active region and a dielectric layer. When the relative high voltage is applied to break down the dielectric layer, stress that is dispersed through the dielectric layer causes a variance of conductive paths of the antifuse. Furthermore, when the breakdown of the dielectric layer is not complete, a resulting conductive path may have high impedance. Thus, antifuses with reliable breakdown when the relative high voltage is applied are desired. Antifuses manufactured simultaneously with transistors usually have a similar structure to a structure of transistor. Thus, an alloy of silicon-germanium (SiGe) implemented to transistors may also be implemented to antifuses.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
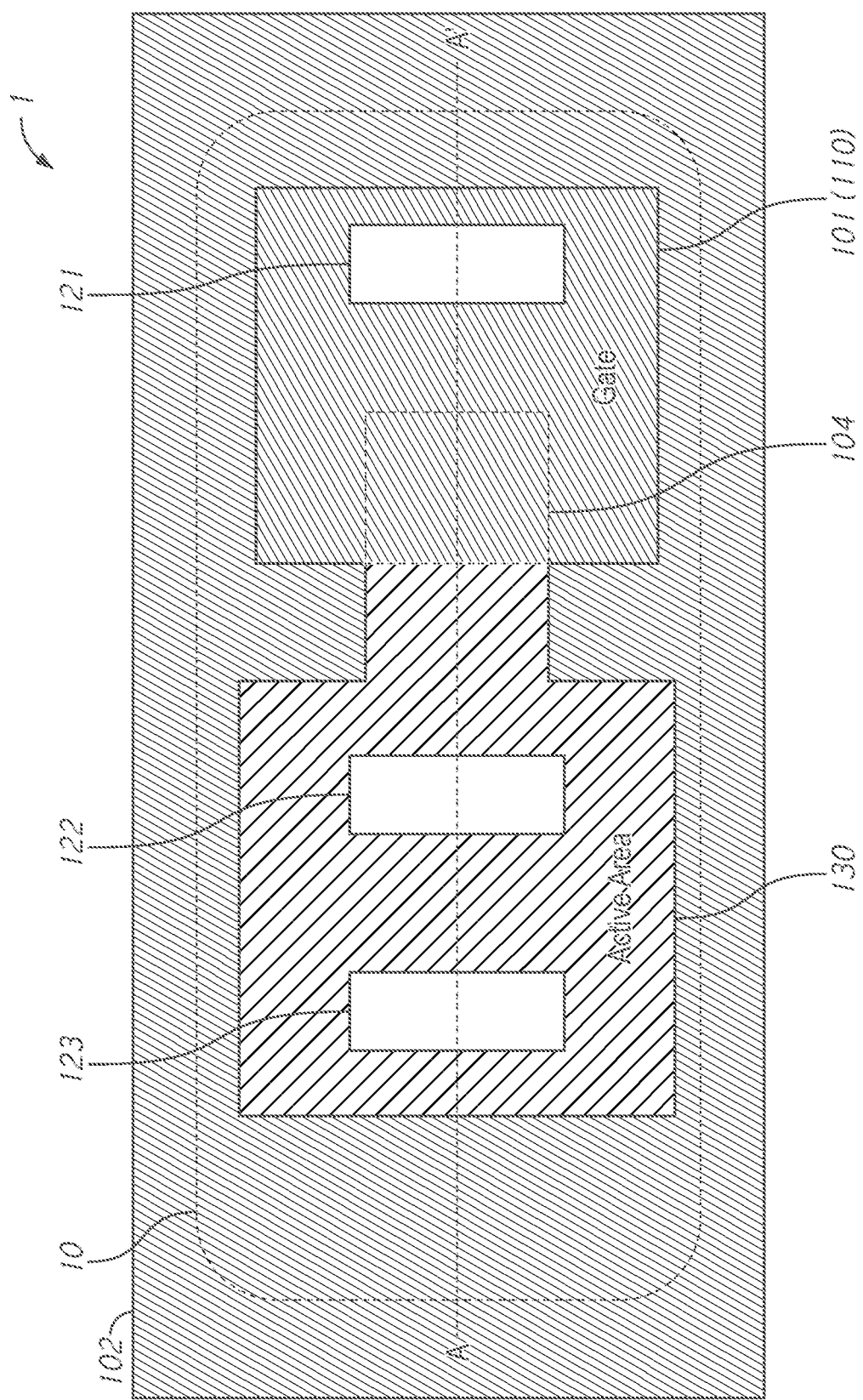
FIG. 1 is a simplified layout diagram of a semiconductor device including an apparatus, in accordance with an embodiment of the present disclosure.
Figure 2:
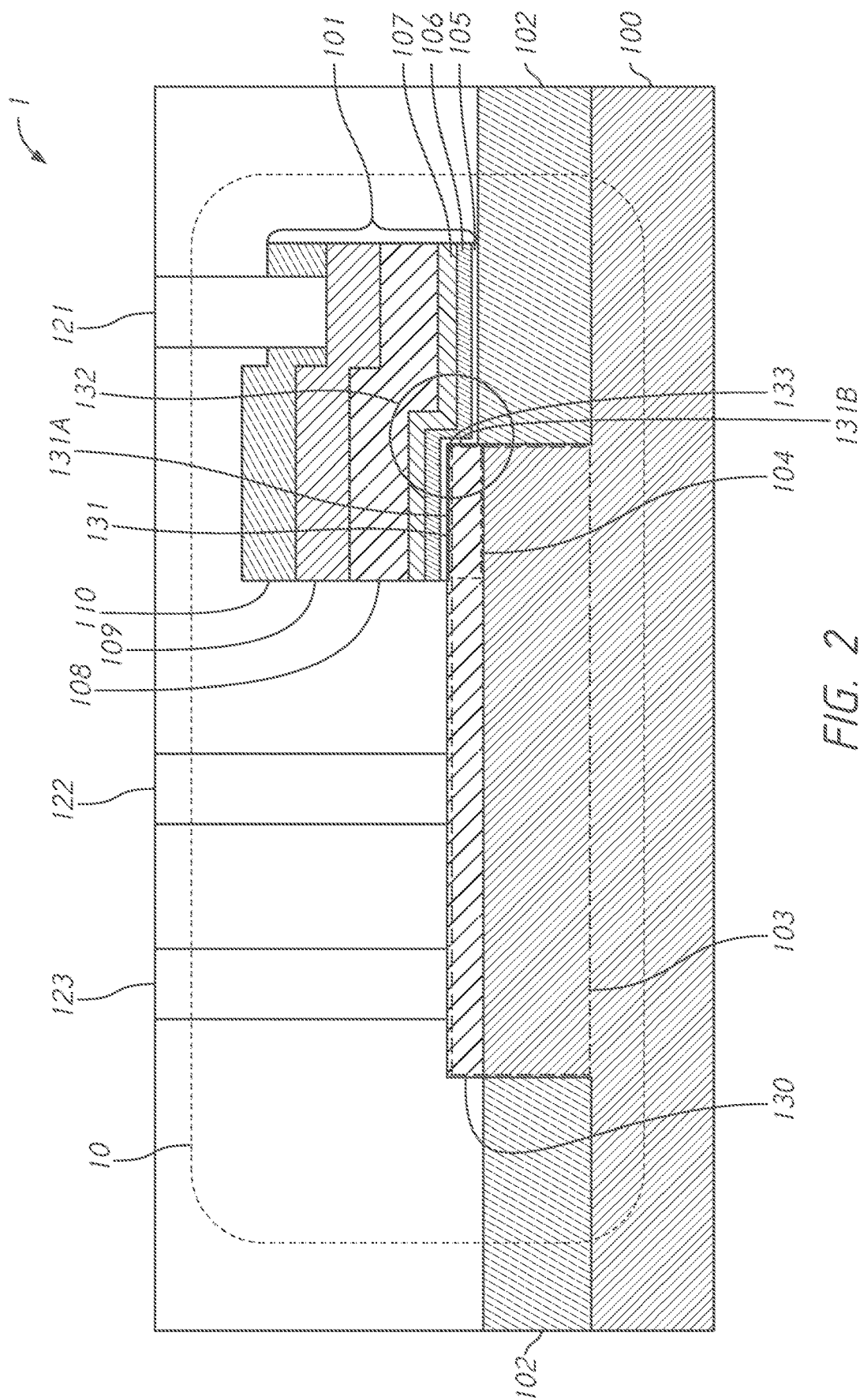
FIG. 2 is a schematic diagram illustrating a vertical cross-sectional view of a schematic structure of the semiconductor device including the apparatus.

Embodiments of the present disclosure will be described with reference to FIG. 1 to FIG. 5. FIG. 1 is a simplified layout diagram of a semiconductor device 1 including an apparatus 10, in accordance with an embodiment of the present disclosure. FIG. 2 is a schematic diagram illustrating a vertical cross-sectional view of a schematic structure of the semiconductor device 1 including the apparatus 10. FIG. 2 may be a cross-sectional view showing the semiconductor device 1 along on a line A-A' shown in FIG. 1. That is, the cross-sectional view covers a portion of the apparatus 10 including a gate electrode 101, an active region 103 and a plurality of conductive plugs 121, 122 and 123. In some embodiments, the apparatus 10 may include a transistor-type structure. For example, the apparatus 10 may be an antifuse. Because the apparatus may include the transistor-type structure, the terminology of transistor is employed in the following description.

The semiconductor device 1 includes a semiconductor substrate 100. The semiconductor substrate 100 may be a silicon wafer including, for example, monocrystalline silicon. The semiconductor device 1 includes an isolation region 102 on the semiconductor substrate 100. The isolation region 102 may include, for example, a shallow trench isolation (STI) structure. The isolation region 102 may be formed by etching trenches in the semiconductor substrate 100 using known lithography technology and anisotropic dry etching technology and depositing an insulating film to fill the trenches. For example, the insulating film may be a silicon oxide film (SiO2), a silicon nitride film (Si3N4), a silicon oxynitride film (SiOxNy), a combination thereof, etc. The apparatus 10 may be disposed on the active region 103 defined by the isolation region 102. The isolation region 102 electrically isolates elements of the apparatus 10 disposed on the semiconductor substrate 100 from other devices (e.g., transistors, antifuses, not shown) disposed on the semiconductor substrate 100. In some embodiments, a main surface that is an exposed surface of the semiconductor substrate 100 without being etched and a top surface of the isolation region 102 may be on a same plane.

A layer 130 may be disposed within the active region 103 and above the semiconductor substrate 100. In some embodiments, the layer 130 may be disposed on the main surface of the semiconductor substrate 100 surrounded by the isolation region 102. In some embodiments, the layer 130 may include a material that has an impedance that is lower than an impedance of a material used in the semiconductor substrate 100. For example, the layer 130 may include an alloy of silicon-germanium (SiGe). In some embodiments, the layer 130 may be formed by epitaxial growth of the silicon-germanium on the active region 103 of the semiconductor substrate 100. Silicon germanium has characteristics to enhance carrier mobility. Another type of a chemical compound film which has a similar effect of increasing carrier mobility may be used as the layer 130. In some embodiments, the layer 130 may include any III-V compound semiconductor obtained by combining group III elements (e.g., boron, aluminum, gallium, indium or thallium) with group V elements (e.g., nitrogen, phosphorus, arsenic, antimony or bismuth). In some embodiments, the layer 130 including any III-V compound semiconductor may be formed by epitaxial growth of the III-V semiconductor. In some embodiments, the layer 130 may include silicon (Si). The layer 130 may be formed as another separate film including silicon on the semiconductor substrate 100. Alternatively, the layer 130 may be a portion of the semiconductor substrate 100. By depositing the insulating film that has a thickness less than a depth of the trench, a top portion of the semiconductor substrate 100 may remain as the layer 130.

The apparatus 10 also includes a channel region 104 within the active region 103 and below the gate electrode 101. In some embodiments, the channel region 104 of FIGS. 1 and 2 may bean n-type region. However, another type of region (e.g., p-type region) may also be applicable. The apparatus 10 may also include the conductive plugs 122 and 123. The conductive plugs 122 and 123 may be disposed on the layer 130. The conductive plugs 122 and 123 may be electrically coupled to the layer 130. For example, the conductive plugs 122 and 123 may include copper (Cu) or the like. In some embodiments, the conductive plugs 122 and 123 may be a through-dielectric via (TDV) (e.g., through-dielectric conductor). The conductive plugs 122 and 123 may provide conductive paths to a source/drain of the apparatus 10.

The apparatus 10 includes the gate electrode 101 that is above the channel region 104 and the isolation region 102. In some embodiments, the gate electrode 101 may include one or more dielectric layers. In FIG. 2, the one or more dielectric layers include dielectric layers 105 and 106 and another dielectric layer 110. The dielectric layer 105 is above the channel region 104 and the isolation region 102. The dielectric layer 105 may include a portion disposed on the channel region 104 and another portion disposed on the isolation region 102. The dielectric layer 105 may be an insulating film that may be referred to a gate oxide. The gate oxide may include a silicon oxide film (SiO2) for example. The dielectric layer 106 may be disposed on the dielectric layer 105. The dielectric layer 106 may include an insulating film of high-k material with high relative permittivity. The High-k film may include oxidized material containing transition metal and the like. The transition metal may be any one of, for example, yttrium (Y), titanium (Ti), zirconium (Zr), hafnium (Hf), niobium (Nb), and tantalum (Ta).

In some embodiments, the gate electrode 101 may further include conductive layers. For example, as shown in FIG. 2, the conductive layers may include conductive layers 107, 108 and 109. The conductive layer 107 may be disposed on the dielectric layer 106. In some embodiments, the conductive layer 107 may include, for example, titanium nitride (TiN). In some embodiments, the apparatus 10 may be a P-channel type device, and the conductive layer 107 may have a composition ratio between titanium (Ti) and nitrogen (N) suitable for a P-channel type device.

The conductive layer 108 may be disposed on the conductive layer 107. The gate electrode layer 108 may be a poly-silicon (poly-Si) layer including poly-silicon. In some embodiments, the gate electrode layer 108 may be doped with an impurity, for example, phosphorus (P), arsenic (As) or boron (B). The conductive layer 109 may be disposed on the conductive layer 108. The conductive layer 109 may be one or more metal layers. The one or more metal layers may include, for example, tungsten (W) or the like. The dielectric layer 110 may be disposed on the conductive layer 109. The dielectric layer 110 may be an insulating film. The insulating film may include a silicon nitride film (Si3N4) for example. The conductive plug 121 may be disposed through the dielectric layer 110 to be in contact with the conductive layer 109. The conductive plug 121 may be electrically coupled to the conductive layer 109. For example, the conductive plug 121 may include copper (Cu) or the like. In some embodiments, the conductive plug 121 may be a through-dielectric via (TDV) (e.g., through-dielectric conductor).

The channel region 104 may have an interface 131 in contact with the dielectric layer 105 of the gate electrode 101. In some embodiments, the interface 131 may include a portion 131A that may be on a main surface of the layer 130 and is in contact with the dielectric layer 105. In some embodiments, the interface 131 may further include another portion 131B on a side surface of the layer 130 that extends in a direction of a thickness of the layer 130 and is in contact with the dielectric layer 105. The other portion of the interface 131 in the direction of the thickness of the layer 130 may be perpendicular to the main surface of the layer 130. A corner 133 of the interface 131 is disposed at an intersection of the portion and the other portion of the interface 131. Carriers with increased mobility may cause concentration of charged particles at and/or around the corner 133 of the interface 131. When a relatively high voltage is applied to the gate electrode 101 through the conductive layers 109, 108 and 107, a breakdown may be facilitated in the dielectric layers 105 and 106 due to the concentration of the charged particles at and/or around the corner 133 of the interface 131. For example, a breakdown in the dielectric layers 105 and 106 at and/or around the corner 133 of the interface 131 may be caused due to the concentration of the charged particles at and/or around the corner 133 of the interface 131. Thus, a conductive path may be created through the dielectric layers 105 and 106 at and/or around the corner 133 of the interface 131. For example, the conductive path may include an end in proximity to the corner 133.

Figure 3:
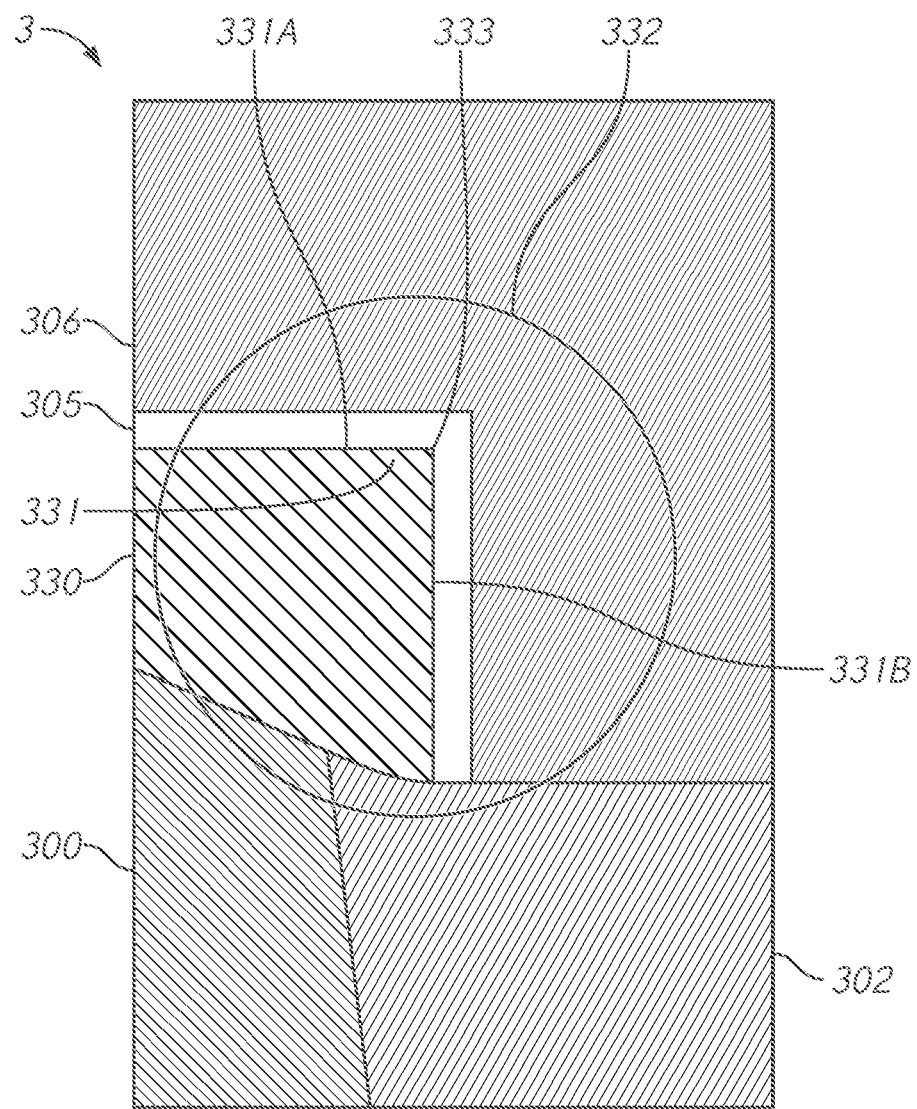
FIG. 3 is a schematic diagram illustrating a vertical cross-sectional view of a schematic structure of a portion of an apparatus according to the embodiment of the present disclosure.

FIG. 3 is a schematic diagram illustrating a vertical cross-sectional view of a schematic structure of a portion 3 of an apparatus according to the embodiment of the present disclosure. The portion 3 may include a portion 332 of an apparatus. In some embodiments, the apparatus may include a transistor-type structure. For example, the apparatus may be an antifuse. The portion 3 includes a semiconductor substrate 300. The semiconductor substrate 300 may be a silicon wafer including, for example, monocrystalline silicon. The portion 3 includes an isolation region 302. The isolation region 302 may include, for example, a shallow trench isolation (STI) structure. The isolation region 302 may be formed by etching trenches in the semiconductor substrate 300 using known lithography technology and anisotropic dry etching technology and depositing an insulating film to fill the trenches. For example, the insulating film may be a silicon oxide film (SiO2), a silicon nitride film (Si3N4), a silicon oxynitride film (SiOxNy), a combination thereof, etc.

A layer 330 may be disposed above the semiconductor substrate 300. In some embodiments, the layer 330 may include a material that has an impedance that is lower than an impedance of a material used in the semiconductor substrate 300. For example, the layer 330 may include an alloy of silicon-germanium (SiGe). In some embodiments, the layer 330 may be formed by epitaxial growth of the silicon-germanium on the semiconductor substrate 300. Silicon germanium has characteristics to enhance carrier mobility. Another type of a chemical compound film which has a similar effect of increasing carrier mobility may be used as the layer 330. In some embodiments, the layer 330 may include any III-V compound semiconductor obtained by combining group III elements (e.g., boron, aluminum, gallium, indium or thallium) with group V elements (e.g., nitrogen, phosphorus, arsenic, antimony or bismuth). In some embodiments, the layer 330 including any III-V compound semiconductor may be formed by epitaxial growth of the III-V semiconductor. In some embodiments, the layer 330 may include silicon (Si). The layer 330 may be formed as another separate film including silicon on the semiconductor substrate 300. In some embodiments, the layer 330 may extend further above the isolation region 302 as shown in FIG. 3. Alternatively, the layer 330 may be a portion of the semiconductor substrate 300. By depositing the insulating film that has a thickness less than a depth of the trench, a top portion of the semiconductor substrate 300 may remain as the layer 330.

One or more dielectric layers of a gate electrode may be disposed on or above the layer 330 and the isolation region 302. In some embodiments, the one or more dielectric layers include dielectric layers 305 and 306. In some embodiments, the dielectric layers 305 and 306 may be a portion of a gate electrode, such as the gate electrode 101 of FIGS. 1 and 2. The dielectric layer 305 may be disposed on the layer 330 and the isolation region 302. Thus, the dielectric layer 305 may be in contact with a main surface and a side surface of the layer 330. The dielectric layer 305 may be an insulating film that may be referred to a gate oxide. The gate oxide may include a silicon oxide film (SiO2) for example. The dielectric layer 306 may be disposed on the dielectric layer 305. The dielectric layer 306 may include an insulating film of high-k material with high relative permittivity. The High-k film may include, oxidized material containing transition metal and the like. The transition metal may be any one of, for example, yttrium (Y), titanium (Ti), zirconium (Zr), hafnium (Hf), niobium (Nb), and tantalum (Ta).

The portion 332 may have a similar structure as a structure of a portion 132 of the apparatus 10 in FIG. 2. The portion 3 may include an interface 331 in contact with the dielectric layer 305. The interface 331 may include a portion 331A on the main surface of the layer 330 and in contact with the dielectric layer 305. The interface 331 may further include another portion 331B on the side surface of the layer 330 in a direction of a thickness of the layer 330 and in contact with the dielectric layer 305. The other portion of the interface 331 in the direction of the thickness of the layer 330 may be perpendicular to the main surface of the layer 330. A corner 333 of the interface 331 is disposed at an intersection of the portion and the other portion of the interface 331. Carriers with increased mobility may cause concentration of charged particles at and/or around the corner 333 of the interface 331. When a relatively high voltage is applied to the dielectric layers 305 and 306, a breakdown may be facilitated in the dielectric layers 305 and 306 due to the concentration of the charged particles at and/or around the corner 333 of the interface 331. For example, a breakdown in the dielectric layers 305 and 306 at and/or around the corner 333 of the interface 331 may be caused due to the concentration of the charged particles at and/or around the corner 333 of the interface 331. Thus, a conductive path may be created through the dielectric layers 305 and 306 at and/or around the corner 333 of the interface 331. For example, the conductive path may include an end in proximity to the corner 333.

Figure 4:
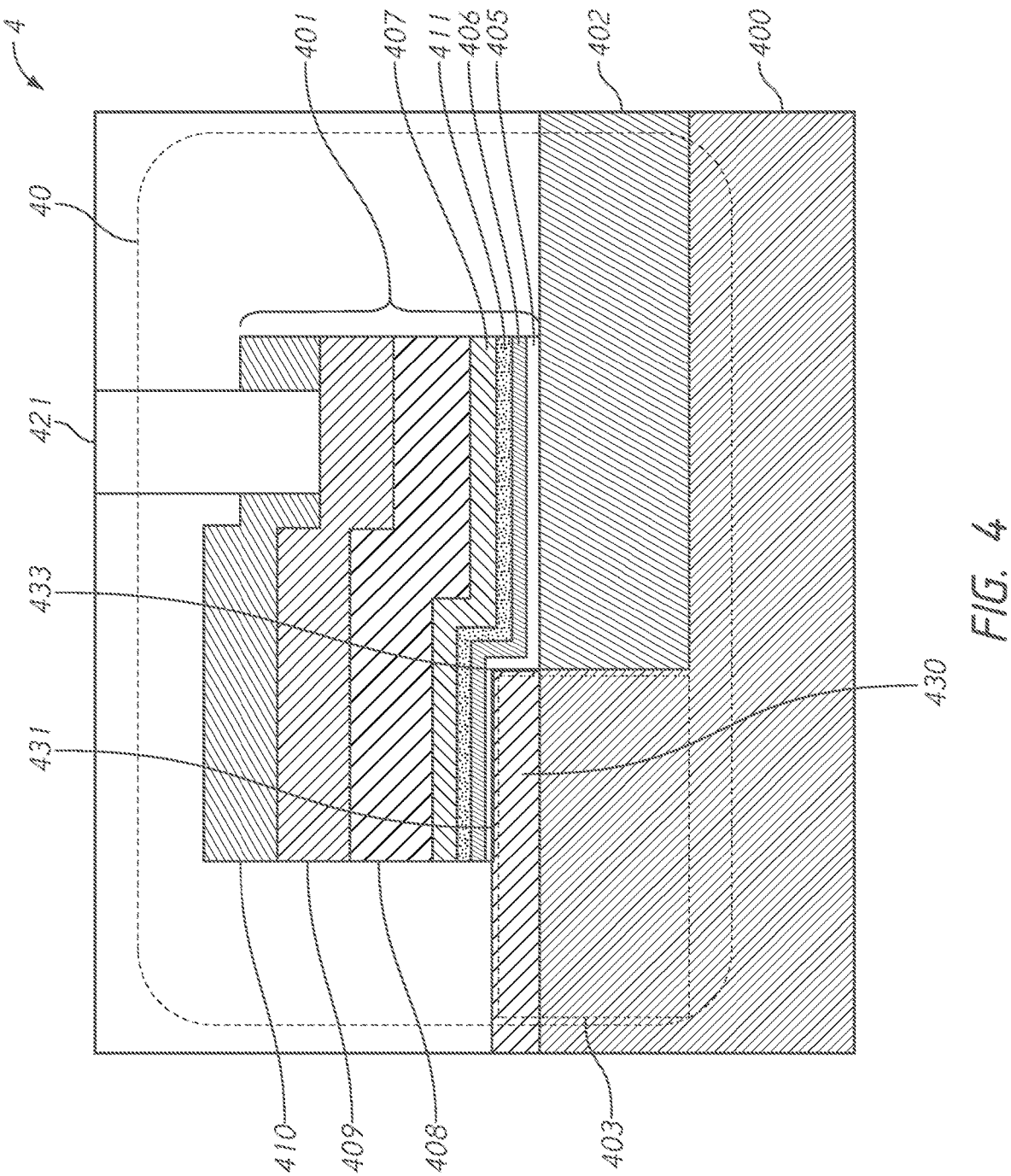
FIG. 4 is a schematic diagram illustrating a vertical cross-sectional view of a schematic structure of a semiconductor device including an apparatus according to the embodiment of the present disclosure.

FIG. 4 is a schematic diagram illustrating a vertical cross-sectional view of a schematic structure of a semiconductor device 4 including an apparatus 40 according to the embodiment of the present disclosure. In some embodiments, the apparatus 40 may include a transistor-type structure. For example, the apparatus 40 may be an antifuse. The semiconductor device 4 includes a semiconductor substrate 400. The semiconductor substrate 400 may be a silicon wafer including, for example, monocrystalline silicon. The semiconductor device 4 includes an isolation region 402 on the semiconductor substrate 400. The isolation region 402 may include, for example, a shallow trench isolation (STI) structure. The isolation region 402 may be formed by etching trenches in the semiconductor substrate 400 using known lithography technology and anisotropic dry etching technology and depositing an insulating film to fill the trenches. For example, the insulating film may be a silicon oxide film (SiO2), a silicon nitride film (Si3N4), a silicon oxynitride film (SiOxNy), a combination thereof, etc. The apparatus 40 may be disposed on the active region 403 defined by the isolation region 402. The isolation region 402 electrically isolates elements of the apparatus 40 disposed on the semiconductor substrate 400 from other devices (e.g., transistors, antifuses, not shown) disposed on the semiconductor substrate 400. In some embodiments, a main surface of the semiconductor substrate 100 without being etched and a top surface of the isolation region 402 may be on a same plane.

A layer 430 may be disposed above the semiconductor substrate 400. In some embodiments, the layer 430 may be disposed on the main surface of the semiconductor substrate 400 surrounded by the isolation region 402. In some embodiments, the layer 430 may include a material that has an impedance that is lower than an impedance of a material used in the semiconductor substrate 400. For example, the layer 430 may include an alloy of silicon-germanium (SiGe). In some embodiments, the layer 430 may be formed by epitaxial growth of the silicon-germanium on the semiconductor substrate 400. Silicon germanium has characteristics to enhance carrier mobility. Another type of a chemical compound film which has a similar effect of increasing carrier mobility may be used as the layer 430. In some embodiments, the layer 430 may include any III-V compound semiconductor obtained by combining group III elements (e.g., boron, aluminum, gallium, indium or thallium) with group V elements (e.g., nitrogen, phosphorus, arsenic, antimony or bismuth). In some embodiments, the layer 430 including any III-V compound semiconductor may be formed by epitaxial growth of the III-V semiconductor. In some embodiments, the layer 430 may include silicon (Si). The layer 430 may be formed as another separate film including silicon on the semiconductor substrate 400. Alternatively, the layer 430 may be a portion of the semiconductor substrate 400. By depositing the insulating film that has a thickness less than a depth of the trench, a top portion of the semiconductor substrate 400 may remain as the layer 430.

The apparatus 40 includes the gate electrode 401 that is above a portion of the layer 430 and a portion of the isolation region 402. In some embodiments, the gate electrode 401 may include one or more dielectric layers. In FIG. 4, the one or more dielectric layers include dielectric layers 405, 406 and 411 and another dielectric layer 410. The dielectric layer 405 may include a portion disposed on the layer 430 and another portion disposed on the isolation region 402. The dielectric layer 405 may be an insulating film that may be referred to a gate oxide. The gate oxide may include a silicon oxide film (SiO2) for example. The dielectric layer 406 may be disposed on the dielectric layer 405. The dielectric layer 406 may include an insulating film of high-k material with high relative permittivity. The High-k film may include, oxidized material containing transition metal and the like. The transition metal may be any one of, for example, yttrium (Y), titanium (Ti), zirconium (Zr), hafnium (Hf), niobium (Nb), and tantalum (Ta). The dielectric layer 411 may be formed on the dielectric layer 406. The dielectric layer 411, together with another conductive layer above the dielectric layer 411 may control an effective work function (EWF) to adjust a threshold voltage (Vt). The dielectric layer 411 may include an insulating layer. The insulating layer may include oxidized material including, for example, aluminum oxide (AlxOy), lanthanum oxide (LaxOy), etc.

In some embodiments, the gate electrode 401 may further include conductive layers. For example, as shown in FIG. 4, the conductive layers may include conductive layers 407, 408 and 409. The conductive layer 407 may be disposed on the dielectric layer 411. In some embodiments, the conductive layer 407 may include, for example, titanium nitride (TiN). In some embodiments, the apparatus 40 may be P-channel type MOSFET, and the conductive layer 407 may have a composition ratio between titanium (Ti) and nitrogen (N) suitable for a P-channel type MOSFET.

The conductive layer 408 may be disposed on the conductive layer 407. The gate electrode layer 408 may be a poly-silicon (poly-Si) layer including poly-silicon. In some embodiments, the gate electrode layer 408 may be doped with an impurity, for example, phosphorus (P), arsenic (As) or boron (B). The conductive layer 409 may be disposed on the conductive layer 408. The conductive layer 409 may be one or more metal layers. The one or more metal layers may include, for example, tungsten (W) or the like. The dielectric layer 410 may be disposed on the conductive layer 409. The dielectric layer 405 may be an insulating film. The insulating film may include a silicon nitride film (Si3N4) for example. A conductive plug 421 may be disposed through the dielectric layer 410 to be in contact with the conductive layer 409.

The conductive plug 421 may be electrically coupled to the conductive layer 409. For example, the conductive plug 421 may include copper (Cu) or the like. In some embodiments, the conductive plug 421 may be a through-dielectric via (TDV) (e.g., through-dielectric conductor).

The layer 430 may have an interface 431 in contact with the dielectric layer 405 of the gate electrode 401. In some embodiments, the interface 431 may include a portion that may be on a main surface of the layer 430 and is in contact with the dielectric layer 405. In some embodiments, the interface 431 may further include another portion on a side surface of the layer 430 in a direction of a thickness of the layer 430 in contact with the dielectric layer 405. The main surface of the layer 430 may be perpendicular to the other portion of the interface 431 in the direction of the thickness of the layer 430. A corner 433 of the interface 431 is disposed at an intersection of the portion and the other portion of the interface 431. Carriers with increased mobility may cause concentration of charged particles at and/or around the corner 433 of the interface 431. When a relatively high voltage is applied to the gate electrode 401 through the conductive layers 409, 408 and 407, a breakdown may be facilitated in the dielectric layers 405, 406 and 411 due to the concentration of the charged particles at and/or around the corner 433 of the interface 431. For example, a breakdown in the dielectric layers 405, 406 and 411 at and/or around the corner 433 of the interface 431 may be caused due to the concentration of the charged particles at and/or around the corner 433 of the interface 431. Thus, a conductive path may be created through the dielectric layers 405, 406 and 411 at and/or around the corner 433 of the interface 431. For example, the conductive path may include an end in proximity to the corner 433.

Figure 5:
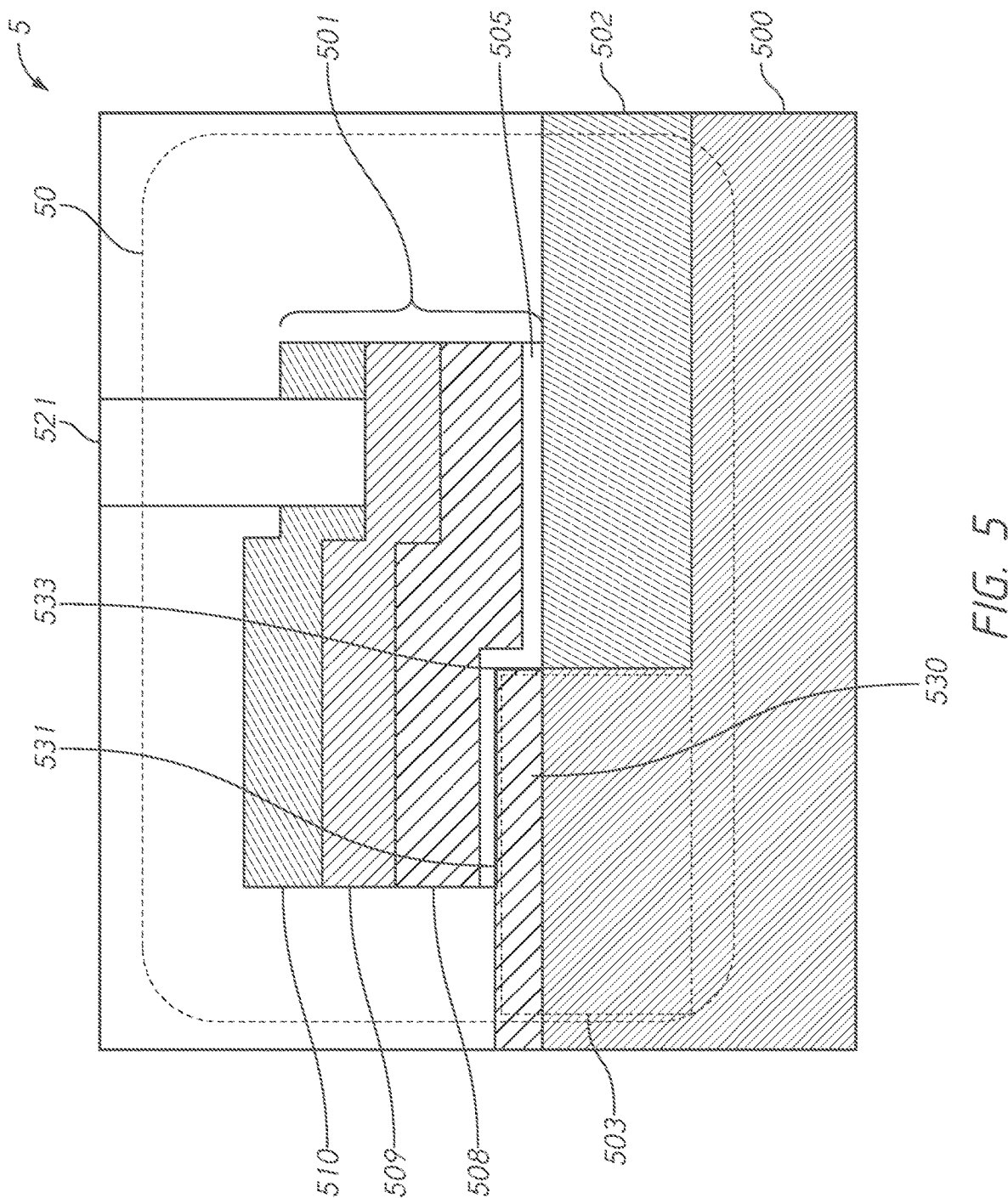
FIG. 5 is a schematic diagram illustrating a vertical cross-sectional view of a schematic structure of a semiconductor device including an apparatus according to the embodiment of the present disclosure.

FIG. 5 is a schematic diagram illustrating a vertical cross-sectional view of a schematic structure of a semiconductor device 5 including an apparatus 50 according to the embodiment of the present disclosure. In some embodiments, the apparatus 50 may include a transistor-type structure. For example, the apparatus 50 may be an antifuse. The semiconductor device 5 includes a semiconductor substrate 500. The semiconductor substrate 500 may be a silicon wafer including, for example, monocrystalline silicon. The semiconductor device 5 includes an isolation region 502 on the semiconductor substrate 500. The isolation region 502 may include, for example, a shallow trench isolation (STI) structure. The isolation region 502 may be formed by etching trenches in the semiconductor substrate 500 using known lithography technology and anisotropic dry etching technology and depositing an insulating film to fill the trenches. For example, the insulating film may be a silicon oxide film (SiO2), a silicon nitride film (Si3N4), a silicon oxynitride film (SiOxNy), a combination thereof, etc. The apparatus 50 may be disposed on the active region 503 defined by the isolation region 502. The isolation region 502 electrically isolates elements of the apparatus 50 disposed on the semiconductor substrate 500 from other devices (e.g., transistors, antifuses, not shown) disposed on the semiconductor substrate 500. In some embodiments, a main surface of the semiconductor substrate 500 without being etched and a top surface of the isolation region 502 may be on a same plane.

A layer 530 may be disposed above the semiconductor substrate 500. In some embodiments, the layer 530 may be disposed on the main surface of semiconductor substrate 50) surrounded by the isolation region 502. In some embodiments, the layer 530 may include a material that has an impedance that is lower than an impedance of a material used in the semiconductor substrate 500. For example, the layer 530 may include an alloy of silicon-germanium (SiGe). In some embodiments, the layer 530 may be formed by epitaxial growth of the silicon-germanium on the semiconductor substrate 500. Silicon germanium has characteristics to enhance carrier mobility. Another type of a chemical compound film which has a similar effect of increasing carrier mobility may be used as the layer 530. In some embodiments, the layer 530 may include any III-V compound semiconductor obtained by combining group III elements (e.g., boron, aluminum, gallium, indium or thallium) with group V elements (e.g., nitrogen, phosphorus, arsenic, antimony or bismuth). In some embodiments, the layer 530 including any III-V compound semiconductor may be formed by epitaxial growth of the III-V semiconductor. In some embodiments, the layer 530 may include silicon (Si). The layer 530 may be formed as another separate film including silicon on the semiconductor substrate 500. Alternatively, the layer 530 may be a portion of the semiconductor substrate 500. By depositing the insulating film that has a thickness less than a depth of the trench, a top portion of the semiconductor substrate 500 may remain as the layer 530.

The apparatus 50 includes the gate electrode 501 that is above a portion of the layer 530 and a portion of the isolation region 502. In some embodiments, the gate electrode 501 may include one or more dielectric layers. In FIG. 5, the one or more dielectric layers include a dielectric layer 505 and another dielectric layer 510. The dielectric layer 505 is above a portion of the layer 530 and a portion of the isolation region 502. The dielectric layer 505 may include a portion disposed on the layer 530 and another portion disposed on the isolation region 502. The dielectric layer 505 may be an insulating film that may be referred to a gate oxide. The gate oxide may include a silicon oxide film (SiO2), a silicon nitride film (Si3N4), a silicon oxynitride film (SiOxNy), a combination thereof, etc., for example.

In some embodiments, the gate electrode 501 may further include conductive layers. For example, as shown in FIG. 5, the conductive layers may include conductive layers 508 and 509. The conductive layer 508 may be disposed on the dielectric layer 505. The gate electrode layer 508 may be a poly-silicon (poly-Si) layer including poly-silicon. In some embodiments, the gate electrode layer 508 may be doped with an impurity. In some embodiments, the apparatus 50 may be an N-channel type MOSFET, and the conductive layer 507 may be doped with n-type impurity such as phosphorus, arsenic or antimony suitable for an N-channel type MOSFET. In some embodiments, the apparatus 50 may be a P-channel type MOSFET, and the conductive layer 507 may be doped with p-type impurity such as boron or indium suitable for an N-channel type MOSFET.

The conductive layer 509 may be disposed on the conductive layer 508. The conductive layer 509 may be one or more metal layers. The one or more metal layers may include, for example, tungsten (W) or the like. The dielectric layer 510 may be disposed on the conductive layer 509. The dielectric layer 505 may be an insulating film. The insulating film may include a silicon nitride film (Si3N4) for example. A conductive plug 521 may be disposed through the dielectric layer 510 to be in contact with the conductive layer 509. The conductive plug 521 may be electrically coupled to the conductive layer 509. For example, the conductive plug 521 may include copper (Cu) or the like. In some embodiments, the conductive plug 521 may be a through-dielectric via (TDV) (e.g., through-dielectric conductor).

The layer 530 may have an interface 531 in contact with the dielectric layer 505 of the gate electrode 501. In some embodiments, the interface 531 may include a portion that may be on a main surface of the layer 530 in contact with the dielectric layer 505. In some embodiments, the interface 531 may further include another portion on a side surface of the layer 530 in a direction of a thickness of the layer 530 and is in contact with the dielectric layer 505. The other portion of the interface 531 in the direction of the thickness of the layer 530 may be perpendicular to the main surface of the layer 530. A corner 533 of the interface 531 is disposed at an intersection of the portion and the other portion of the interface 531. Carriers with increased mobility may cause concentration of charged particles at and/or around the corner 533 of the interface 531. When a relatively high voltage is applied to the gate electrode 501 through the conductive layers 509 and 508, a breakdown may be facilitated in the dielectric layer 505 due to the concentration of the charged particles at and/or around the corner 533 of the interface 531. For example, a breakdown in the dielectric layer 505 may be caused due to the concentration of the charged particles at and/or around the corner 533 of the interface 531. Thus, a conductive path may be created through the dielectric layer 505 at and/or around the corner 533 of the interface 531. For example, the conductive path may include an end in proximity to the corner 533.

In the embodiments described above, DRAM is described as an example of the semiconductor devices 1, 3, 4 and 5 according to various embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device 1. Furthermore, devices other than memory, including logic ICs such as a microprocessor and an application-specific integrated circuit (ASIC) for example are also applicable as the semiconductor devices 1, 3, 4 and 5 according to the foregoing embodiments.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

The invention claimed is:

1. An apparatus, comprising:
   a substrate, the substrate including an active region defined by an isolation region, the isolation region including a shallow trench insulation structure formed in the substrate;
   a first conductive layer on a first surface of the substrate, the first surface being in the active region, the first conductive layer including an interface;
   a second conductive layer; and a plurality of dielectric layers disposed on one another between the first conductive layer and the second conductive layer, the plurality of dielectric layers including a conductive path responsive to a voltage applied on the dielectric layers, wherein the interface includes:
a first portion on a second surface of the first conductive layer in contact with the dielectric layer;
a second portion perpendicular to the first portion, the second portion in contact with the dielectric layer; and
a corner at an intersection of the first portion and the second portion, the corner being an outward corner,
the dielectric layers include a corner overlapping the outward corner of the interface, and
the conductive path has an end in proximity to the corner of the interface to facilitate breakdown of the dielectric layers at and/or around the corners of the interface and the dielectric layers due to concentration of charged particles at and/or around the corners upon application of the voltage, wherein
the active region includes a channel region,
the first conductive layer includes a low impedance layer laterally positioned to the channel region in the active region, and
the apparatus further comprises a plurality of conductive plugs in contact with the low impedance layer.

2. The apparatus of claim 1, wherein the first conductive layer comprises a material having an impedance lower than an impedance of a material included in the substrate.

3. The apparatus of claim 2, wherein the first conductive layer includes III-V compound semiconductor including group III elements and group V elements.

4. The apparatus of claim 3, wherein the material includes silicon-germanium.

5. The apparatus of claim 3, wherein the first conductive layer is formed by epitaxial growth.

6. An apparatus, comprising:
a substrate, the substrate including an active region defined by an isolation region, the isolation region including a shallow trench insulation structure formed in the substrate;
a layer on a surface of the substrate, the surface being in the active region, the layer including an interface, the interface including a corner on first and second portions of the layer, the second potion being perpendicular to the first portion; and
a plurality of dielectric layers disposed on one another on the layer, wherein
the layer includes III-V compound semiconductor including group III elements and group V elements,
the dielectric layers are configured to include a conductive path responsive to a voltage applied on the dielectric layers, and
the conductive path includes an end in proximity to the corner of the interface to facilitate breakdown of the dielectric layers at and/or around the corners of the interface and the dielectric layers due to concentration of charged particles at and/or around the corners upon application of the voltage, wherein
the active region includes a channel region,
the layer includes a low impedance layer laterally positioned to the channel region in the active region, and
the apparatus further comprises a plurality of conductive plugs in contact with the low impedance layer.

7. The apparatus of claim 6, wherein the layer is formed as another film.

8. The apparatus of claim 6, wherein the layer is formed by depositing an insulating film in a trench on the semiconductor substrate, and
wherein a thickness of the insulating film is less than a depth of the trench.

9. The apparatus of claim 6, wherein the layer is formed by epitaxial growth of the III-V semiconductor.

10. The apparatus of claim 6, wherein the layer includes silicon-germanium.

11. An apparatus, comprising:
a substrate, the substrate including an active region defined by an isolation region, the isolation region including a shallow trench insulation structure formed in the substrate;
a first conductive layer on a first surface of the substrate, the first surface being in the active region, the first conductive layer having main and side surfaces above the first surface of the substrate, the first conductive layer including an interface on the main and side surfaces, the interface including a corner at an intersection of the main and side surfaces;
a second conductive layer;
a plurality of dielectric layers disposed on one another between the first conductive layer and the second conductive layer, the plurality of dielectric layers covering at least a first portion of the main surface of the first conductive layer and at least a second portion of the side surface of the first conductive layer; and
a conductive path between the first and second conductive layers and through the dielectric layers, the conductive path being responsive to a voltage applied on the dielectric layers, wherein
the conductive path has an end in proximity to the corner of the interface to facilitate breakdown of the dielectric layers at and/or around the corners of the interface and the dielectric layers due to concentration of charged particles at and/or around the corners upon application of the voltage, wherein
the active region includes a channel region,
the first conductive layer includes a low impedance layer laterally positioned to the channel region in the active region, and
the apparatus further comprises a plurality of conductive plugs in contact with the low impedance layer.

12. The apparatus of claim 11, wherein at least one of the dielectric layers includes gate oxide.

13. The apparatus of claim 12, wherein the gate oxide includes a silicon oxynitride film.

14. The apparatus of claim 11, wherein the dielectric layers include a first dielectric layer and a second dielectric layer on the first dielectric layer, and
wherein the second dielectric layer includes a high-k film.

15. The apparatus of claim 14, further comprising an isolation layer on the second dielectric layer.

16. The apparatus of claim 15, wherein the isolation layer includes an aluminum oxide.

17. The apparatus of claim 14, wherein the high-k film includes oxidized transition metal.

* * * * *